US012777878B2

(12) United States Patent
Nakashima et al.

(10) Patent No.: US 12,777,878 B2
(45) Date of Patent: Oct. 27, 2026

(54) SUBSTRATE PROCESSING APPARATUS AND SUBSTRATE PROCESSING METHOD

(71) Applicant: Tokyo Electron Limited, Tokyo (JP)

(72) Inventors: Tsunenaga Nakashima, Koshi City (JP); Hiroaki Inadomi, Koshi City (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 493 days.

(21) Appl. No.: 18/333,019

(22) Filed: Jun. 12, 2023

(65) Prior Publication Data

US 2023/0402303 A1 Dec. 14, 2023

(30) Foreign Application Priority Data

Jun. 13, 2022 (JP) ................................ 2022-095173

(51) Int. Cl.

*H10P 72/00* (2026.01)
*H10P 50/24* (2026.01)
*H10P 70/00* (2026.01)
*H10P 72/30* (2026.01)

(52) U.S. Cl.

CPC ........ *H10P 72/0456* (2026.01); *H10P 50/242* (2026.01); *H10P 70/80* (2026.01); *H10P 72/0408* (2026.01); *H10P 72/0421* (2026.01); *H10P 72/0458* (2026.01); *H10P 72/0466* (2026.01); *H10P 72/3218* (2026.01); *H10P 72/3306* (2026.01); *H10P 72/3312* (2026.01)

(58) Field of Classification Search

CPC ............. H10P 72/0456; H10P 72/3312; H10P 72/0408; H10P 72/0421; H10P 72/0458; H10P 72/0466; H10P 50/242; H10P 72/3218; H10P 72/3306; H10P 70/80

USPC .......................................................... 134/61

See application file for complete search history.

(56) References Cited

U.S. PATENT DOCUMENTS

2019/0355574 A1* 11/2019 Kanno .................... H10P 70/80

FOREIGN PATENT DOCUMENTS

| | | |
|---|---|---|
| JP | 2005-101074 A | 4/2005 |
| JP | 2007-524229 A | 8/2007 |
| JP | 2018-160509 A | 10/2018 |
| JP | 2019-201201 A | 11/2019 |
| JP | 2022-057884 A | 4/2022 |

(Continued)

*Primary Examiner* — Tinsae B Ayalew

(74) *Attorney, Agent, or Firm* — Chrisman Gallo Tochtrop LLC

(57) ABSTRACT

A substrate processing apparatus includes a liquid processing apparatus configured to form a liquid film on a surface of a substrate; a supercritical drying apparatus configured to dry the substrate by replacing the liquid film with a supercritical fluid; a first load-lock apparatus configured to switch an atmosphere around the substrate from a first one of a normal pressure atmosphere and a decompressed pressure atmosphere to a second one thereof on a transfer path of the substrate; a dry-cleaning apparatus configured to dry-clean the surface of the substrate under a decompressed pressure; and a control device configured to perform forming of the liquid film by the liquid processing apparatus, drying of the substrate by the supercritical drying apparatus, switching of the atmosphere around the substrate by the first load-lock apparatus, and dry-cleaning of the substrate by the dry-cleaning apparatus in this order.

16 Claims, 11 Drawing Sheets

(56) References Cited

FOREIGN PATENT DOCUMENTS

| | | | |
|---|---|---|---|
| KR | 10-2014-0048989 | A | 4/2014 |
| WO | 2004/114394 | A1 | 12/2004 |

* cited by examiner

SUBSTRATE PROCESSING APPARATUS AND SUBSTRATE PROCESSING METHOD

CROSS-REFERENCE TO RELATED APPLICATION

This application claims the benefit of Japanese Patent Application No. 2022-095173 filed on Jun. 13, 2022, the entire disclosure of which is incorporated herein by reference.

TECHNICAL FIELD

The various aspects and embodiments described herein pertain generally to a substrate processing apparatus and a substrate processing method.

BACKGROUND

Patent Document 1 describes a supercritical drying method. In the supercritical drying method, a surface of a substrate is dried by exposing the substrate to a supercritical fluid for a certain period of time in the state that a liquid adheres to the surface of the substrate. As an example of this liquid, alcohol or the like is used.

Patent Document 1: Japanese Patent Laid-open Publication No. 2005-101074

SUMMARY

In one exemplary embodiment, a substrate processing apparatus includes a liquid processing apparatus, a supercritical drying apparatus, a first load-lock apparatus, a dry-cleaning apparatus and a control device. The liquid processing apparatus is configured to form a liquid film on a surface of a substrate. The supercritical drying apparatus is configured to dry the substrate by replacing the liquid film with a supercritical fluid. The first load-lock apparatus is configured to switch an atmosphere around the substrate from a first one of a normal pressure atmosphere and a decompressed pressure atmosphere to a second one of the normal pressure atmosphere and the decompressed pressure atmosphere on a transfer path of the substrate. The dry-cleaning apparatus is configured to dry-clean the surface of the substrate under a decompressed pressure. The control device is configured to perform forming of the liquid film by the liquid processing apparatus, drying of the substrate by the supercritical drying apparatus, switching of the atmosphere around the substrate by the first load-lock apparatus, and dry-cleaning of the substrate by the dry-cleaning apparatus in this order.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
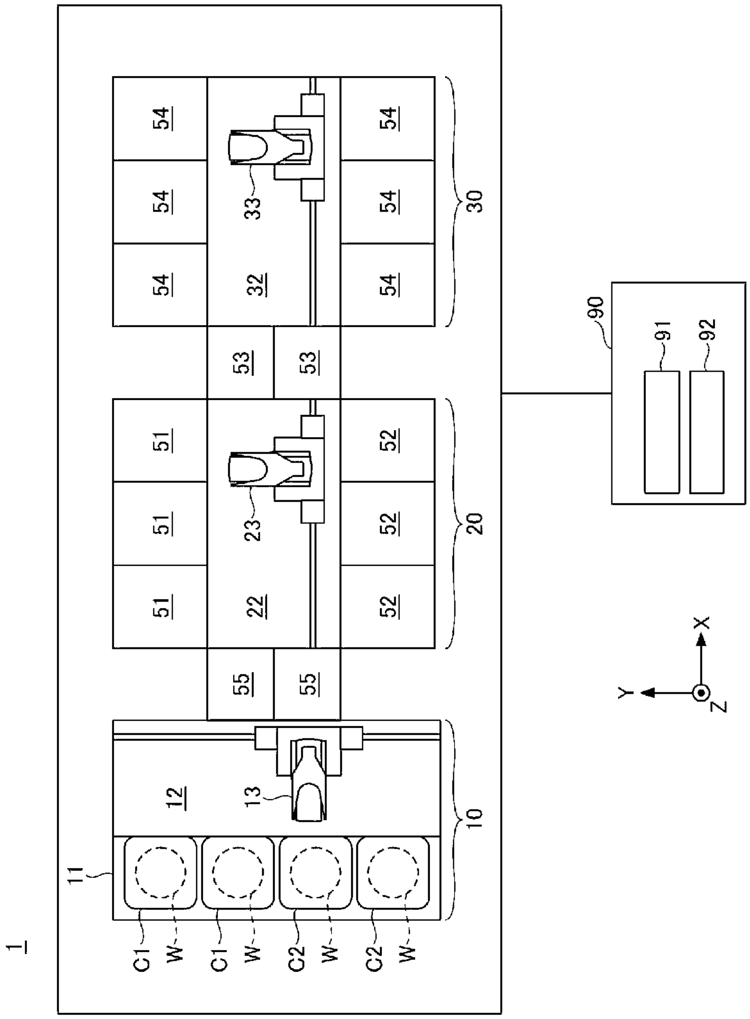
FIG. 1 is a plan view illustrating a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of the present disclosure will be described with reference to the accompanying drawings. In the various drawings, same or corresponding parts will be assigned same reference numerals, and redundant description thereof will be omitted. The X-axis direction, the Y-axis direction, and the Z-axis direction are orthogonal to each other. Further, the X-axis direction and the Y-axis direction are horizontal directions, whereas the Z-axis direction is a vertical direction.

In the present specification, "normal pressure" refers to a pressure of 80 kPa to 120 kPa, and "decompressed pressure" refers to a pressure of 0 Pa to 1 kPa. The atmosphere of "normal pressure atmosphere" and "decompressed pressure atmosphere" may be an atmospheric atmosphere or an inert atmosphere. The inert atmosphere contains a nitrogen gas or a rare gas. The rare gas is, for example, an argon gas.

Figure 3A:
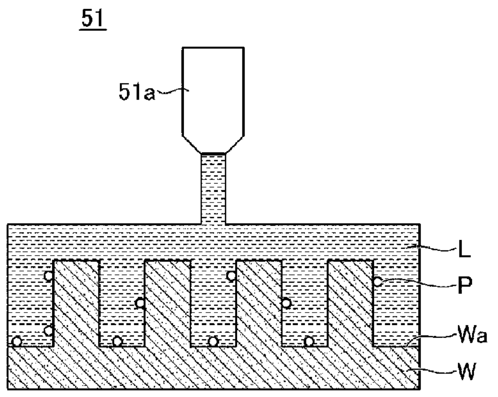
FIG. 3A to FIG. 3C are diagrams illustrating an example of a process S101, an example of a process S102, and an example of a process S104, respectively.
Figure 3B:
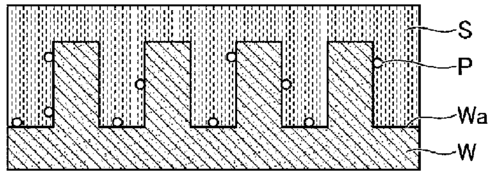
Figure 3C:
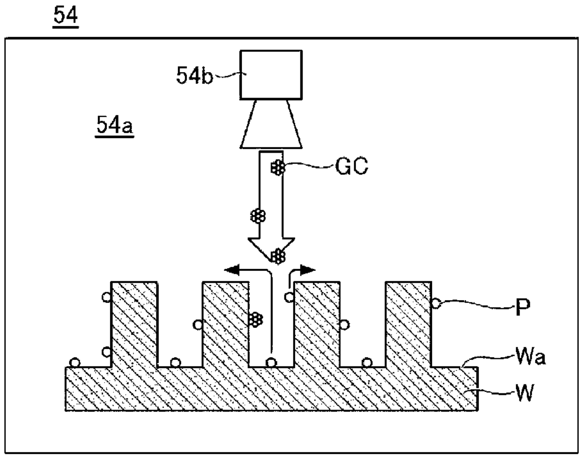

Referring to FIG. 1, a substrate processing apparatus 1 according to an exemplary embodiment will be described. The substrate processing apparatus 1 includes a liquid processing apparatus 51, a supercritical drying apparatus 52, a first load-lock apparatus 53, a dry-cleaning apparatus 54, and a control device 90. The liquid processing apparatus 51 is configured to form a liquid film L on a surface Wa of a substrate W (substrate surface Wa), as shown in FIG. 3A. The supercritical drying apparatus 52 is configured to dry the substrate W by replacing the liquid film L with a supercritical fluid S, as shown in FIG. 3B. The first load-lock apparatus 53 is configured to switch the atmosphere around the substrate W from one of the normal pressure atmosphere and the decompressed pressure atmosphere to the other on a transfer path of the substrate W. The dry-cleaning apparatus 54 is configured to dry-clean the surface Wa of the substrate W under the decompressed pressure, as shown in FIG. 3C.

The control device 90 is, for example, a computer, and includes an operation unit 91 such as a CPU (Central Processing Unit) and a storage 92 such as a memory. The storage 92 stores therein a program for controlling various kinds of processings performed in the substrate processing apparatus 1. The control device 90 controls the operation of the substrate processing apparatus 1 by causing the operation unit 91 to execute the program stored in the storage 92.

The control device 90 performs the forming of the liquid film L by the liquid processing apparatus 51, the drying of the substrate W by the supercritical drying apparatus 52, the switching of the atmosphere around the substrate W by the first load-lock apparatus 53, and the dry-cleaning of the substrate W by the dry-cleaning apparatus 54 in this order mentioned. By switching the atmosphere around the substrate W by the first load-lock apparatus 53, the inside of the dry-cleaning apparatus 54 can be maintained in the decompressed pressure atmosphere, so that the throughput of the substrate processing apparatus 1 can be improved. In addition, the cleanliness of the substrate W after the supercritical drying performed by the dry-cleaning apparatus 54 can be improved.

The dry-cleaning apparatus 54 cleans the substrate W without wetting the substrate W with a liquid. Therefore, a liquid-gas interface does not appear in an irregularity pattern of the surface Wa of the substrate W. As a result, generation of a surface tension can be suppressed, so that collapse of the irregularity pattern can be avoided. The substrate W may be cleaned by a wet cleaning apparatus instead of the dry-cleaning apparatus 54. In such a case, however, the supercritical drying needs to be performed again in order to suppress the collapse of the irregularity pattern, resulting in the decrease in throughput.

As depicted in FIG. 1, the substrate processing apparatus 1 includes, for example, a first block 10, a second block 20, a third block 30, the first load-lock apparatus 53, and a transition apparatus 55. The first block 10, the transition apparatus 55, the second block 20, the first load-lock apparatus 53, and the third block 30 are arranged in a row in a horizontal direction in this order.

The first block 10 has a first placing table 11, a first transfer section 12, and a first transfer device 13. The first placing table 11 places thereon a first cassette C1 and a second cassette C2. The first cassette C1 accommodates therein a plurality of substrates W before being processed. The substrate W includes, for example, a semiconductor substrate. The semiconductor substrate includes a silicon wafer or a compound semiconductor wafer. The substrate W may include a glass substrate instead of the semiconductor substrate. The surface Wa of the substrate W may have a device such as an electronic circuit, or may have an irregularity pattern. The second cassette C2 accommodates a plurality of substrates W after being processed.

The first transfer section 12 is provided between the first placing table 11 and the transition apparatus 55. The first transfer section 12 is in the normal pressure atmosphere. The first transfer device 13 is configured to transfer the substrate W in the first transfer section 12. The first transfer device 13 takes out the substrate W before being processed from the first cassette C1. Further, the first transfer device 13 places the substrate W after being processed in the second cassette C2. The first transfer device 13 has a transfer arm configured to hold the substrate W. The transfer arm is movable in horizontal and vertical directions, and is also pivotable around a vertical axis.

The second block 20 includes the liquid processing apparatus 51, the supercritical drying apparatus 52, a second transfer section 22, and a second transfer device 23. The second transfer section 22 is provided between the transition apparatus 55 and the first load-lock apparatus 53. The second transfer section 22 is in the normal pressure atmosphere. The second transfer device 23 is configured to transfer the substrate W in the second transfer section 22. The second transfer device 23 transfers the substrate W between a plurality of apparatuses adjacent to the second transfer section 22. The second transfer device 23 has a transfer arm configured to hold the substrate W. The transfer arm is movable in horizontal and vertical directions, and is also pivotable around a vertical axis.

Figure 12:
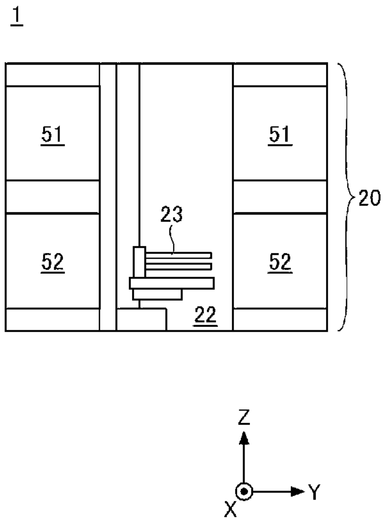
FIG. 12 is a side view illustrating the substrate processing apparatus according to the sixth modification example.

In the second block 20, the liquid processing apparatus 51 and the supercritical drying apparatus 52 are disposed to face each other in the horizontal direction with the second transfer section 22 therebetween. Further, as depicted in FIG. 12, in the second block 20, the liquid processing apparatus 51 and the supercritical drying apparatus 52 may be stacked on top of each other on at least one side (on both sides in FIG. 12) of the second transfer section 22. In the latter case, when the substrate W is transferred from the liquid processing apparatus 51 to the supercritical drying apparatus 52, the collapse of the liquid film L (overflow of the liquid) due to the horizontal movement of the substrate W can be suppressed, as compared to the former case.

The third block 30 has the dry-cleaning apparatus 54, a third transfer section 32, and a third transfer device 33. The third transfer section 32 is in the decompressed pressure atmosphere. The third transfer device 33 transfers the substrate W in the third transfer section 32. The third transfer device 33 is configured to transfer the substrate W between a plurality of apparatuses adjacent to the third transfer section 32. The third transfer device 33 has a transfer arm configured to hold the substrate W. The transfer arm is movable in horizontal and vertical directions, and is also pivotable around a vertical axis.

The transition apparatus 55 is disposed between the first block 10 and the second block 20. The transition apparatus 55 is provided adjacent to the first transfer section 12 and the second transfer section 22, and serves to deliver the substrate W between the first transfer device 13 and the second transfer device 23. A plurality of transition apparatuses 55 may be stacked in the vertical direction.

The first load-lock apparatus 53 is disposed between the second block 20 and the third block 30. The first load-lock apparatus 53 is provided adjacent to the second transfer section 22 and the third transfer section 32, and serves to deliver the substrate W between the second transfer device 23 and the third transfer device 33. A plurality of first load-lock apparatuses 53 may be stacked in the vertical direction.

Figure 2:
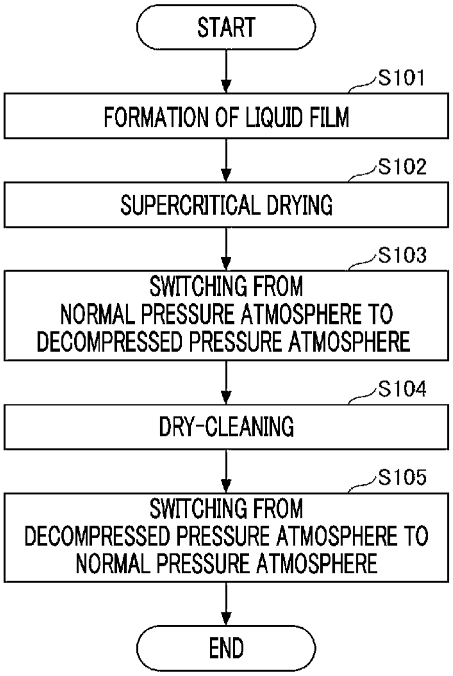
FIG. 2 is a flowchart illustrating a substrate processing method according to the exemplary embodiment.

A substrate processing method according to the exemplary embodiment will be described with reference to FIG. 1 to FIG. 3C. The substrate processing method includes, for example, processes S101 to S105, as shown in FIG. 2. The processes S101 to S105 are performed under the control of the control device 90. In addition, the substrate processing method may also include processes other than the processes S101 to S105.

First, the first cassette C1 accommodating therein a plurality of substrates W and the second cassette C2 in an empty state are placed on the first placing table 11 of the first block 10. Then, the first transfer device 13 takes out the substrate W from the first cassette C1, and transfers it to the transition apparatus 55. Thereafter, the second transfer device 23 takes out the substrate W from the transition apparatus 55, and transfers it to the liquid processing apparatus 51.

Subsequently, the liquid processing apparatus 51 forms the liquid film L on the substrate surface Wa, as shown in FIG. 3A (process S101). The liquid processing apparatus 51 includes, by way of example, a non-illustrated spin chuck configured to hold the substrate W horizontally while allowing the substrate surface Wa to face upwards, and a nozzle 51*a* configured to supply a processing liquid to the substrate surface Wa. While the substrate W is being rotated by the spin chuck, the nozzle 51*a* supplies the processing liquid to a central portion of the substrate surface Wa. The processing liquid is diffused onto the entire substrate surface Wa by a centrifugal force, so that the liquid film L is formed on the entire substrate surface Wa. Multiple kinds of processing liquids may be sequentially supplied to the substrate surface Wa so that multiple kinds of liquid films L may be sequentially formed. After the process S101, the second transfer device 23 takes out the substrate W from the liquid processing apparatus 51, and transfers it to the supercritical drying apparatus 52.

Next, the supercritical drying apparatus 52 dries the substrate W by replacing the liquid film L with the supercritical fluid S, as shown in FIG. 3B (process S102). Although not shown, the supercritical drying apparatus 52 has, for example, a pressure vessel accommodating therein the substrate W, a supply line configured to supply the supercritical fluid S to the pressure vessel, and an exhaust line configured to exhaust the supercritical fluid S from the pressure vessel. The supercritical fluid S is a fluid having a temperature equal to or higher than a critical temperature and a pressure equal to or higher than a critical pressure, and is in a state in which a liquid and a gas are not distinguished. When the liquid film L is replaced with the supercritical fluid S, the liquid-gas interface in the irregularity pattern of the substrate W can be suppressed from occurring. As a result, the generation of the surface tension can be suppressed, so that the collapse of the irregularity pattern can be suppressed. The liquid film L is, for example, an organic solvent such as IPA (isopropyl alcohol), and the supercritical fluid S is, for example, $CO_2$. Upon the completion of the process S102, the second transfer device 23 takes out the substrate W from the supercritical drying apparatus 52, and transfers it to the first load-lock apparatus 53.

Thereafter, the first load-lock apparatus 53 switches the atmosphere around the substrate W from the normal pressure atmosphere to the decompressed pressure atmosphere (process S103). Although not shown, the first load-lock apparatus 53 includes, for example, a processing vessel having a load-lock chamber formed therein, and a pressure control mechanism configured to adjust the pressure of the load-lock chamber. In the load-lock chamber, a placing table on which the substrate W is placed is provided. The pressure control mechanism has, for example, an exhaust mechanism configured to exhaust a gas of the load-lock chamber and a gas supply mechanism configured to supply a gas to the load-lock chamber. The pressure control mechanism switches the atmosphere of the load-lock chamber from one of the normal pressure atmosphere and the decompressed pressure atmosphere to the other. After the process S103, the third transfer device 33 takes out the substrate W from the first load-lock apparatus 53, and transfers it to the dry-cleaning apparatus 54.

Next, as illustrated in FIG. 3C, the dry-cleaning apparatus 54 dry-cleans the surface Wa of the substrate W under the decompressed pressure (process S104). The dry-cleaning apparatus 54 radiates a gas cluster GC to the substrate surface Wa under the decompressed pressure, for example. The gas cluster GC may reach the inside of a narrow recess, removing a particle P from the inside of the recess. The dry-cleaning apparatus 54 has, for example, a cleaning chamber 54*a* accommodating therein the substrate W, and has a nozzle 54*b* in the cleaning chamber 54*a*.

The nozzle 54*b* is configured to discharge a source gas of the gas cluster GC. The source gas is cooled to a condensation temperature by adiabatic expansion in the previously decompressed cleaning chamber 54*a* to form the gas cluster GC, which is a collection of molecules or atoms. The source gas includes, for example, at least one selected from a carbon dioxide ($CO_2$) gas and an argon (Ar) gas.

The nozzle 54*b* may discharge a mixed gas of the source gas and a carrier gas onto the substrate surface Wa. The carrier gas lowers the partial pressure of the source gas, and thus suppresses liquefaction of the source gas inside the nozzle 54*b*. In addition, the carrier gas enhances the acceleration of the source gas, thus promoting the growth of the gas cluster GC. The carrier gas has a molecular weight or atomic weight smaller than that of the source gas. Therefore, the carrier gas has a higher condensation temperature than the source gas. Therefore, the carrier gas does not form the gas clusters GC. The carrier gas includes, for example, at least one selected from a hydrogen ($H_2$) gas and a helium (He) gas.

The gas cluster GC collides with the particle P adhering to the substrate surface Wa, and blows the particle P away. Here, the gas cluster GC does not have to directly collide with the particle P. The gas cluster GC may blow away the particle P around a collision position. Since the gas cluster GC becomes a high temperature due to the collision, it is scattered and decomposed to be exhausted from an exhaust opening of the cleaning chamber 54*a*. The blown particle P is also removed from the exhaust opening of the cleaning chamber 54*a*.

The dry-cleaning apparatus 54 radiates the gas cluster GC perpendicularly to the substrate surface Wa. The devices are formed on the substrate surface Wa in advance, and the irregularity pattern is also formed thereon in advance. If the gas cluster GC is radiated perpendicularly to the substrate surface Wa, the collapse of the irregularity pattern due to the collision of the gas clusters GC can be suppressed, and the particle P can be removed from the inside of the recess.

Upon the completion of the process S104, the third transfer device 33 takes out the substrate W from the dry-cleaning apparatus 54, and transfers it to the first load-lock apparatus 53.

Then, the first load-lock apparatus 53 switches the atmosphere around the substrate W from the decompressed pressure atmosphere to the normal pressure atmosphere (process S105). After the process S105, the second transfer device 23 takes out the substrate W from the first load-lock apparatus 53, and transfers it to the transition apparatus 55. Thereafter, the first transfer device 13 takes out the substrate W from the transition apparatus 55, and places it in the second cassette C2. In this way, the series of processes are completed.

According to the present exemplary embodiment, the first block 10, the transition apparatus 55, the second block 20, the first load-lock apparatus 53, and the third block 30 are arranged in a row in the horizontal direction in the order mentioned, as shown in FIG. 1. Since both the first transfer section 12 and the second transfer section 22 are in the normal pressure atmosphere, the simpler and less expensive transition apparatus 55 can be used instead of a load-lock apparatus. Further, when the cleanliness of the substrate W is high after the supercritical drying so that the dry-cleaning of the substrate W is not necessary, the substrate W may be placed in the second cassette C2 without being transferred to the third block 30. When the dry-cleaning is unnecessary, the transfer path of the substrate W can be shortened, so that the throughput of the substrate processing apparatus 1 can be improved.

Figure 4:
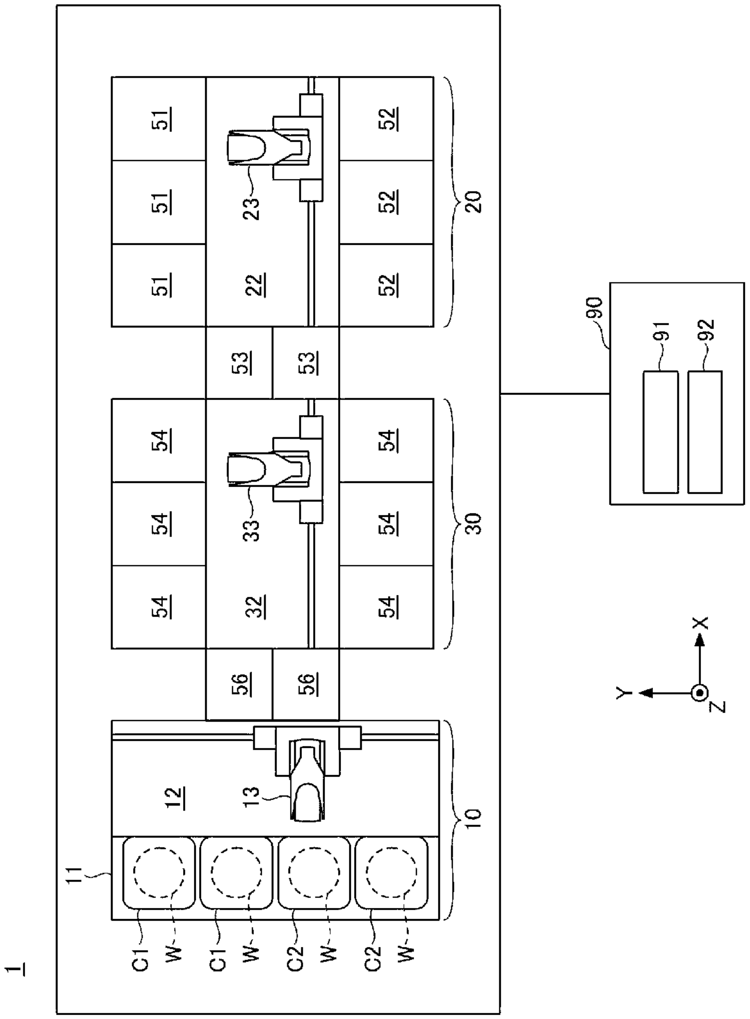
FIG. 4 is a plan view illustrating a substrate processing apparatus according to a first modification example.

Now, referring to FIG. 4, the substrate processing apparatus 1 according to a first modification example will be described. Hereinafter, the description will mainly focus on distinctive features from the above-described exemplary embodiment. As shown in FIG. 4, the first block 10, a second load-lock apparatus 56, the third block 30, the first load-lock apparatus 53, and the second block 20 are arranged in a row in the horizontal direction in the order mentioned.

The second load-lock apparatus 56 has the same configuration as the first load-lock apparatus 53, and serves to switch the atmosphere around the substrate W from one of the normal pressure atmosphere and the decompressed pressure atmosphere to the other on a transfer path of the substrate W. The second load-lock apparatus 56 is provided adjacent to the first transfer section 12 in the normal pressure atmosphere and the third transfer section 32 in the decompressed pressure atmosphere.

The substrate processing apparatus 1 according to the present modification example is operated as follows. First, the first transfer device 13 takes out the substrate W from the first cassette C1, and transfers it to the second load-lock apparatus 56. Then, the second load-lock apparatus 56 switches the atmosphere around the substrate W from the normal pressure atmosphere to the decompressed pressure atmosphere. Thereafter, the third transfer device 33 takes out the substrate W from the second load-lock apparatus 56, and transfers it to the first load-lock apparatus 53. Then, the first load-lock apparatus 53 switches the atmosphere around the substrate W from the decompressed pressure atmosphere to the normal pressure atmosphere. Subsequently, the second transfer device 23 takes out the substrate W from the first load-lock apparatus 53, and transfers it to the liquid processing apparatus 51.

Next, the liquid processing apparatus 51 forms the liquid film L on the substrate surface Wa, as shown in FIG. 3A (process S101). After the process S101, the second transfer device 23 takes out the substrate W from the liquid processing apparatus 51, and transfers it to the supercritical drying apparatus 52. Then, the supercritical drying apparatus 52 dries the substrate W by replacing the liquid film L with the supercritical fluid S, as shown in FIG. 3B (process S102). After the process S102, the second transfer device 23 takes out the substrate W from the supercritical drying apparatus 52, and transfers it to the first load-lock apparatus 53.

Afterwards, the first load-lock apparatus 53 switches the atmosphere around the substrate W from the normal pressure atmosphere to the decompressed pressure atmosphere (process S103). After the process S103, the third transfer device 33 takes out the substrate W from the first load-lock apparatus 53, and transfers it to the dry-cleaning apparatus 54. Then, as shown in FIG. 3C, the dry-cleaning apparatus 54 dry-cleans the surface Wa of the substrate W under the decompressed pressure (process S104).

Upon the completion of the process S104, the third transfer device 33 takes out the substrate W from the dry-cleaning apparatus 54, and transfers it to the second load-lock apparatus 56. Then, the second load-lock apparatus 56 switches the atmosphere around the substrate W from the decompressed pressure atmosphere to the normal pressure atmosphere. Thereafter, the first transfer device 13 takes out the substrate W from the second load-lock apparatus 56, and places it in the second cassette C2. In this way, the series of processes are completed.

According to the present modification example, the distance between the first block 10 and the third block 30 is short as compared to the above-described exemplary embodiment. Therefore, the substrate W can be transferred from the dry-cleaning apparatus 54 to the second cassette C2 in a short time after the dry-cleaning is finished. Therefore, the adhesion of the particles to the substrate W during the transfer of the substrate W after the dry-cleaning can be suppressed.

Figure 5:
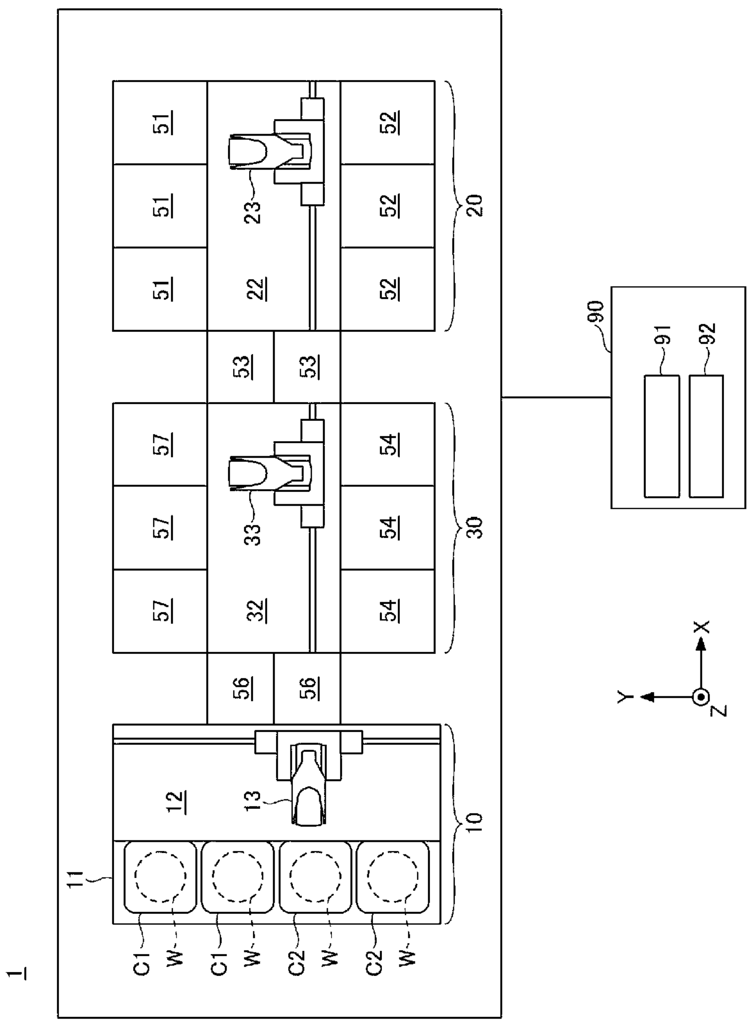
FIG. 5 is a plan view illustrating a substrate processing apparatus according to a second modification example.

Now, referring to FIG. 5, the substrate processing apparatus 1 according to a second modification example will be described. Hereinafter, the description will mainly focus on distinctive features from the first modification example. The third block 30 of the second modification example includes an etching apparatus 57 in addition to the dry-cleaning apparatus 54, the third transfer section 32, and the third transfer device 33. The etching apparatus 57 is configured to etch the substrate surface Wa under the decompressed pressure.

The substrate processing apparatus 1 according to the second modification example is operated as follows. First, the first transfer device 13 takes out the substrate W from the first cassette C1, and transfers it to the second load-lock apparatus 56. Then, the second load-lock apparatus 56 switches the atmosphere around the substrate W from the normal pressure atmosphere to the decompressed pressure atmosphere. Thereafter, the third transfer device 33 takes out the substrate W from the second load-lock apparatus 56, and transfers it to the etching apparatus 57.

Subsequently, the etching apparatus 57 etches the substrate surface Wa under the decompressed pressure. Although the purpose of etching the substrate surface Wa is not particularly limited, it may be performed to remove an unnecessary film, form an irregularity pattern, or modify the surface. The etching apparatus 57 is, for example, a plasma etching apparatus. Then, the third transfer device 33 takes out the substrate W from the etching apparatus 57, and transfers it to the first load-lock apparatus 53. The subsequence processes are the same as those of the first modification example, so redundant description thereof will be omitted.

In addition, the etching apparatus 57 can also be used in the above-described exemplary embodiment or in modification examples to be described below.

Figure 6:
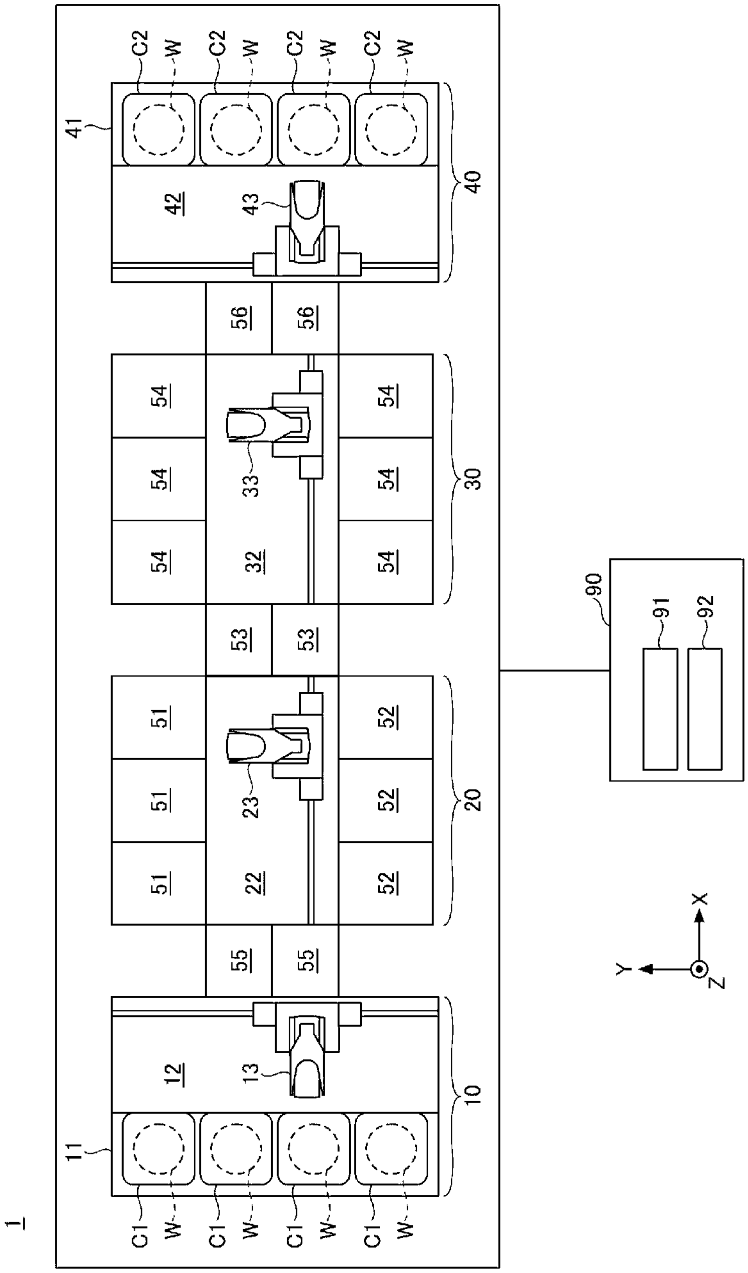
FIG. 6 is a plan view illustrating a substrate processing apparatus according to a third modification example.

Now, referring to FIG. 6, the substrate processing apparatus 1 according to a third modification example will be described. Hereinafter, the description will mainly focus on distinctive features from the above-described exemplary embodiment and modification examples. As depicted in FIG. 6, the first block 10, the transition apparatus 55, the second block 20, the first load-lock apparatus 53, the third block 30, the second load-lock apparatus 56, and a fourth block 40 are arranged in a row in the horizontal direction in the order mentioned.

The first block 10 has the first placing table 11, the first transfer section 12, and the first transfer device 13. The first placing table 11 places thereon the first cassette C1, but does not place thereon the second cassette C2 unlike in the above-described exemplary embodiment and modification examples. The first cassette C1 accommodates therein a plurality of substrates W before being processed. Meanwhile, the second cassette C2 accommodates therein a plurality of substrates W after being processed.

The fourth block 40 has a second placing table 41, a fourth transfer section 42, and a fourth transfer device 43. The second placing table 41 places thereon the second cassette C2. The fourth transfer section 42 is provided between the second placing table 41 and the second load-lock apparatus 56. The fourth transfer section 42 is in the normal pressure atmosphere. The fourth transfer device 43 has the same configuration as the first transfer device 13, and serves to transfer the substrate W in the fourth transfer section 42.

The substrate processing apparatus 1 of the third modification example is operated as follows. Since the operation from the process S101 to the process S104 is the same as that of the above-described exemplary embodiment, description thereof will be omitted here. After the process S104, the third transfer device 33 takes out the substrate W from the dry-cleaning apparatus 54, and transfers it to the second load-lock apparatus 56. Then, the second load-lock apparatus 56 switches the atmosphere around the substrate W from the decompressed pressure atmosphere to the normal pressure atmosphere. Thereafter, the fourth transfer device 43 takes out the substrate W from the second load-lock apparatus 56, and places it in the second cassette C2. In this way, the series of processes are completed.

According to the third modification example, the transfer path of the substrate W from the first cassette C1 to the second cassette C2 is shorter, as compared to the above-described exemplary embodiment and modification examples. Therefore, the throughput of the substrate processing apparatus 1 can be improved. Furthermore, according to the present modification example, the distance between the second cassette C2 and the third block 30 is shorter than that in the above-described exemplary embodiment, the same as in the first modification example and the second modification example. Therefore, the substrate W can be transferred from the dry-cleaning apparatus 54 to the second cassette C2 in a short time after the dry-cleaning. Thus, the adhesion of the particles to the substrate W during the transfer of the substrate W after the dry-cleaning can be suppressed.

Figure 7:
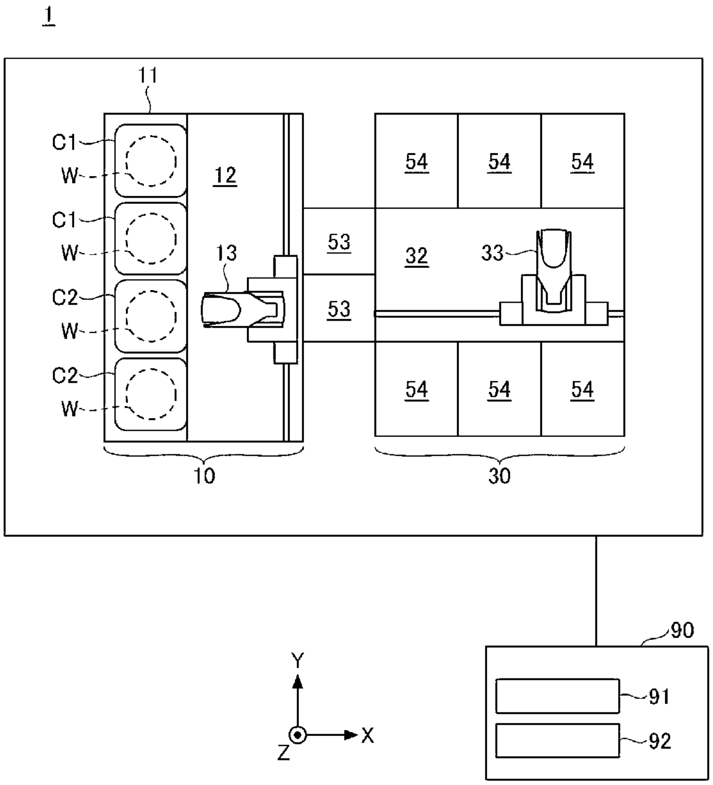
FIG. 7 is a plan view illustrating a substrate processing apparatus according to a fourth modification example.
Figure 8:
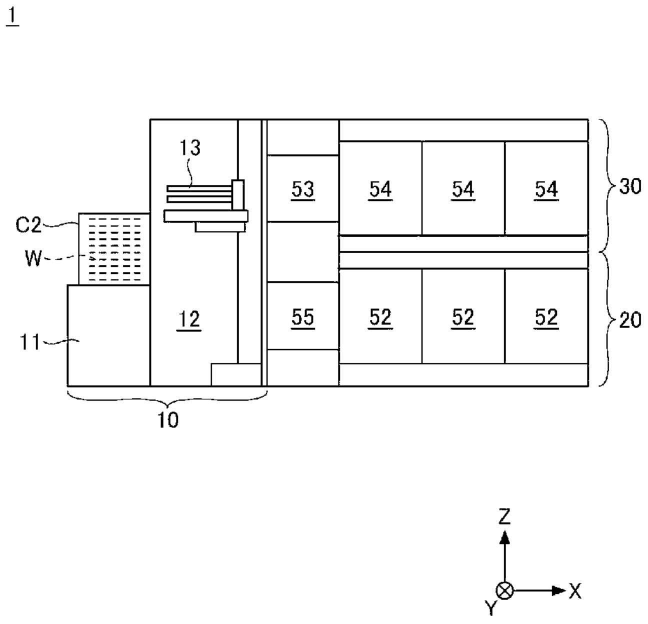
FIG. 8 is a front view illustrating the substrate processing apparatus according to the fourth modification example.
Figure 9:
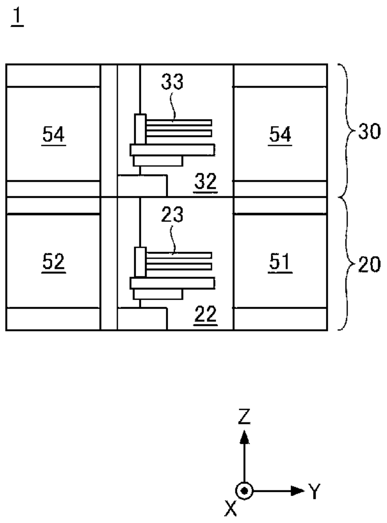
FIG. 9 is a side view illustrating the substrate processing apparatus according to the fourth modification example.

Now, with reference to FIG. 7 to FIG. 9, the substrate processing apparatus 1 according to a fourth modification example will be described. Hereinafter, the description will mainly focus on distinctive features from the above-described exemplary embodiment and modification examples. As depicted in FIG. 8, the second block 20 and the third block 30 are stacked in the vertical direction. The arrangement of the second block 20 and the third block 30 may be reversed, and it does not matter which one of them is located on top. Further, the transition apparatus 55 and the first load-lock apparatus 53 are stacked in the vertical direction. The arrangement of the transition apparatus 55 and the first load-lock apparatus 53 may be reversed, and it does not matter which one of them is located on top. The transition apparatus 55 is provided between the first block 10 and the second block 20. Further, the first load-lock apparatus 53 is provided between the first block 10 and the third block 30.

The substrate processing apparatus 1 of the fourth modification example is operated as follows. Since the operation from the process S101 to the process S102 is the same as that of the above-described exemplary embodiment, description thereof will be omitted here. After the process S102, the second transfer device 23 takes out the substrate W from the supercritical drying apparatus 52, and transfers it to the transition apparatus 55. Then, the first transfer device 13 takes out the substrate W from the transition apparatus 55, and transfers it to the first load-lock apparatus 53.

Next, the first load-lock apparatus 53 switches the atmosphere around the substrate W from the normal pressure atmosphere to the decompressed pressure atmosphere (process S103). After the process S103, the third transfer device 33 takes out the substrate W from the first load-lock apparatus 53, and transfers it to the dry-cleaning apparatus 54. Then, as shown in FIG. 3C, the dry-cleaning apparatus 54 dry-cleans the surface Wa of the substrate W under the decompressed pressure (process S104).

Upon the completion of the process S104, the third transfer device 33 takes out the substrate W from the dry-cleaning apparatus 54, and transfers it to the first load-lock apparatus 53. Then, the first load-lock apparatus 53 switches the atmosphere around the substrate W from the decompressed pressure atmosphere to the normal pressure atmosphere. Thereafter, the first transfer device 13 takes out the substrate W from the first load-lock apparatus 53, and places it in the second cassette C2. In this way, the series of processes are completed.

According to the fourth modification example, the second block 20 and the third block 30 are stacked on top of each other in the vertical direction, and the transition apparatus 55 and the first load-lock apparatus 53 are stacked on top of each other in the vertical direction. Therefore, the footprint (installation area) of the substrate processing apparatus 1 can be reduced. Furthermore, according to the present modification example, in case of processing the substrate W by using either one of the second block 20 or the third block 30, the substrate W may not be transferred to the other one but be placed in the second cassette C2. In either case of processing the substrate W by using the second block 20 only or processing the substrate W by using the third block 30 only, the transfer path of the substrate W can be shortened, so that the throughput of the substrate processing apparatus 1 can be improved.

Figure 10:
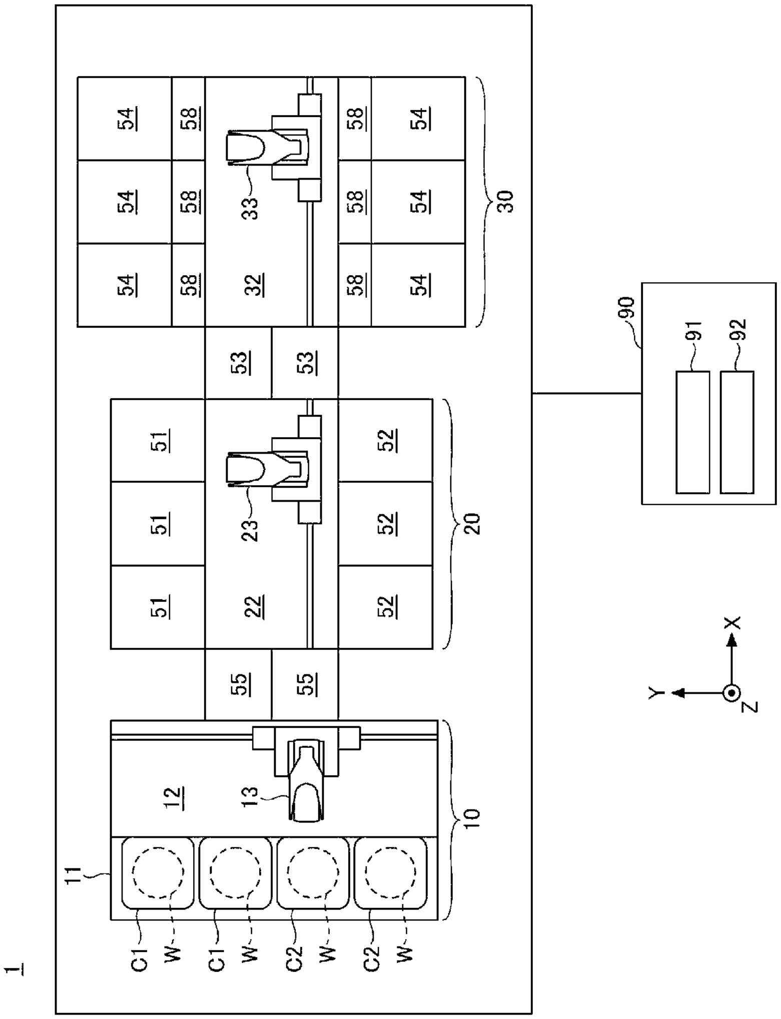
FIG. 10 is a plan view illustrating a substrate processing apparatus according to a fifth modification example.

Now, referring to FIG. 10, the substrate processing apparatus 1 according to a fifth modification example will be described. Hereinafter, the description will mainly focus on distinctive features from the above-described exemplary embodiment and modification examples. As shown in FIG. 10, the third block 30 may have a third load-lock apparatus 58. The third load-lock apparatus 58 has the same configuration as the first load-lock apparatus 53.

The third load-lock apparatus 58 switches the decompression degree of the atmosphere around the substrate W between the third transfer section 32 and the dry-cleaning apparatus 54. The decompression degree is expressed as a differential pressure with respect to the normal pressure. The higher the differential pressure is, the higher the decompression degree may be. The pressure of the third transfer section 32 is lower than the normal pressure and higher than the pressure of the cleaning chamber 54*a* of the dry-cleaning apparatus 54 (see FIG. 3C).

The substrate processing apparatus 1 of the fifth modification example is operated as follows. Since the operation from the process S101 to the process S103 is the same as that of the above-described exemplary embodiment, description thereof will be omitted here. After the process S103, the third transfer device 33 takes out the substrate W from the first load-lock apparatus 53, and transfers it to the third load-lock apparatus 58.

Next, the third load-lock apparatus 58 reduces the pressure of the atmosphere around the substrate W from a first pressure P1 to a second pressure P2 ($P2<P1$). The first pressure P1 is equal to the pressure of the third transfer section 32. The second pressure P2 is equal to the pressure of the cleaning chamber 54*a*.

Thereafter, a non-illustrated internal transfer arm takes out the substrate W from a load-lock chamber of the third load-lock apparatus 58, and transfers it to the dry-cleaning apparatus 54. The internal transfer arm is, for example, a component of the third load-lock apparatus 58, and stands by in the load-lock chamber to carry the substrate W out of the load-lock chamber or to carry the substrate W into the load-lock chamber.

Subsequently, as shown in FIG. 3C, the dry-cleaning apparatus 54 dry-cleans the surface Wa of the substrate W under the decompressed pressure (process S104). After the process S104, the non-illustrated internal transfer arm takes out the substrate W from the dry-cleaning apparatus 54, and transfers it to the load-lock chamber of the third load-lock apparatus 58.

Next, the third load-lock apparatus 58 increases the pressure of the atmosphere around the substrate W from the second pressure P2 to the first pressure P1 ($P2<P1$). Thereafter, the third transfer device 33 takes out the substrate W from the third load-lock apparatus 58, and transfers it to the first load-lock apparatus 53. Since the subsequent processes are the same as in the above-described exemplary embodiment, description thereof will be omitted here.

According to the fifth modification example, the third load-lock apparatus 58 switches the decompression degree of the atmosphere around the substrate W between the third transfer section 32 and the dry-cleaning apparatus 54. Accordingly, the pressure of the third transfer section 32 can be kept lower than the normal pressure and higher than the pressure of the cleaning chamber 54*a* of the dry-cleaning apparatus 54. The volume of the third transfer section 32 is larger than that of the cleaning chamber 54*a*. By setting the pressure of the third transfer section 32 having the larger volume to be relatively high, a load on a vacuum pump can be reduced.

Furthermore, the third load-lock apparatus 58 can be used in the above-described exemplary embodiment or modification examples. Further, the third load-lock apparatus 58 may be provided for each of the dry-cleaning apparatuses 54 individually as shown in FIG. 10, or may be provided adjacent to the dry-cleaning apparatuses 54. In the latter case, the number of the third load-lock apparatuses 58 can be reduced.

Figure 11:
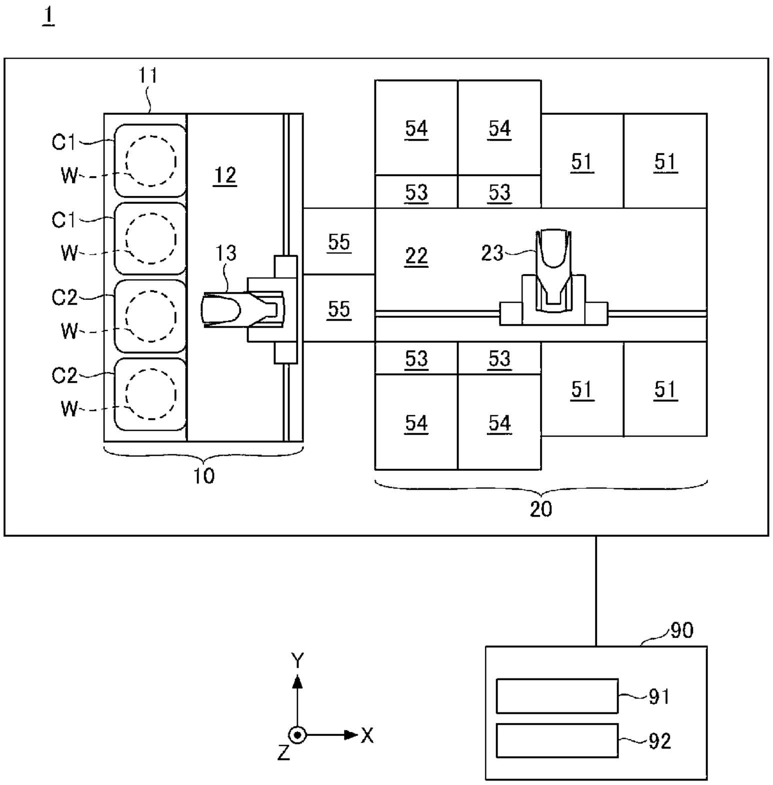
FIG. 11 is a plan view illustrating a substrate processing apparatus according to a sixth modification example.

Now, referring to FIG. 11 and FIG. 12, the substrate processing apparatus 1 according to a sixth modification example will be described. Hereinafter, the description will mainly focus on distinctive features from the above-described exemplary embodiment and modification examples. As shown in FIG. 11, the third block 30 may be omitted, and the second block 20 may include the liquid processing apparatus 51, the supercritical drying apparatus 52 (see FIG. 12), the first load-lock apparatus 53, the dry-cleaning apparatus 54, the second transfer section 22, and the second transfer device 23.

The liquid processing apparatus 51, the supercritical drying apparatus 52, and the first load-lock apparatus 53 are disposed adjacent to the second transfer section 22. The second transfer section 22 is in the normal pressure atmosphere. Accordingly, the dry-cleaning apparatus 54 is disposed adjacent to the first load-lock apparatus 53. The first load-lock apparatus 53 switches the atmosphere around the substrate W from one of the normal pressure atmosphere and the decompressed pressure atmosphere to the other on the transfer path of the substrate W. The first load-lock apparatus 53 may be provided for each of the dry-cleaning apparatuses 54 individually as shown in FIG. 11, or may be provided adjacent to the dry-cleaning apparatuses 54. In the latter case, the number of the first load-lock apparatuses 53 can be reduced.

The substrate processing apparatus 1 of the sixth modification example is operated as follows. Since the operation from the process S101 to the process S103 is the same as that of the above-described exemplary embodiment, description thereof will be omitted here. After the process S103, a non-illustrated internal transfer arm takes out the substrate W from the load-lock chamber of the first load-lock apparatus 53, and transfers it to the dry-cleaning apparatus 54. The internal transfer arm is, for example, a component of the first load-lock apparatus 53, and stands by in the load-lock chamber to carry the substrate W out of the load-lock chamber or to carry the substrate W into the load-lock chamber.

Subsequently, as depicted in FIG. 3C, the dry-cleaning apparatus 54 dry-cleans the surface Wa of the substrate W under the decompressed pressure (process S104). After the process S104, the non-illustrated internal transfer arm takes out the substrate W from the dry-cleaning apparatus 54, and transfers it to the load-lock chamber of the first load-lock apparatus 53. The subsequent processes are the same as in the above-described exemplary embodiment, so redundant description thereof will be omitted.

According to the present modification example, the second block 20 has the liquid processing apparatus 51, the supercritical drying apparatus 52, the first load-lock apparatus 53, the dry-cleaning apparatus 54, the second transfer section 22, and the second transfer device 23. Since the third block 30 is omitted, the structure of the substrate processing apparatus 1 can be simplified.

So far, the exemplary embodiment of the substrate processing apparatus and the substrate processing method according to the present disclosure has been described. However, the present disclosure is not limited to the above-described exemplary embodiment and the like. Various changes, modifications, substitutions, additions, deletions and combinations may be made within the scope of the claims, which are all incorporated within a technical scope of the present disclosure.

According to the exemplary embedment, it is possible to improve the cleanliness of the substrate after being subjected to the supercritical drying.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:

a liquid processing apparatus configured to form a liquid film on a surface of a substrate;

a supercritical drying apparatus configured to dry the substrate by replacing the liquid film with a supercritical fluid;

a first load-lock apparatus configured to switch an atmosphere around the substrate from a first one of a normal pressure atmosphere and a decompressed pressure atmosphere to a second one of the normal pressure atmosphere and the decompressed pressure atmosphere on a transfer path of the substrate;

a dry-cleaning apparatus configured to dry-clean the surface of the substrate under a decompressed pressure;

a control device configured to perform forming of the liquid film by the liquid processing apparatus, drying of the substrate by the supercritical drying apparatus, switching of the atmosphere around the substrate by the first load-lock apparatus, and dry-cleaning of the substrate by the dry-cleaning apparatus in this order;

a first block having a first placing table configured to place thereon a first cassette accommodating therein the substrate, a first transfer section under the normal pressure atmosphere, and a first transfer device configured to transfer the substrate in the first transfer section;

a second block having the liquid processing apparatus, the supercritical drying apparatus, a second transfer section under the normal pressure atmosphere, and a second transfer device configured to transfer the substrate in the second transfer section;

a third block having the dry-cleaning apparatus, a third transfer section under the decompressed pressure atmosphere, and a third transfer device configured to transfer the substrate in the third transfer section; and a transition apparatus configured to deliver the substrate between the first transfer device and the second transfer device, wherein the second block and the third block are stacked on top of each other in a vertical direction, the transition apparatus and the first load-lock apparatus are stacked on top of each other in the vertical direction, the transition apparatus is disposed between the first block and the second block, and the first load-lock apparatus is disposed between the first block and the third block.

2. The substrate processing apparatus of claim 1, further comprising:

a first block having a first placing table configured to place thereon a cassette accommodating therein the substrate, a first transfer section under the normal pressure atmosphere, and a first transfer device configured to transfer the substrate in the first transfer section;

a second block having the liquid processing apparatus, the supercritical drying apparatus, a second transfer section under the normal pressure atmosphere, and a second transfer device configured to transfer the substrate in the second transfer section;

a third block having the dry-cleaning apparatus, a third transfer section under the decompressed pressure atmosphere, and a third transfer device configured to transfer the substrate in the third transfer section; and a transition apparatus configured to deliver the substrate between the first transfer device and the second transfer device, wherein the first block, the transition apparatus, the second block, the first load-lock apparatus, and the third block are arranged in a row in a horizontal direction in this order.

3. The substrate processing apparatus of claim 1, further comprising:

a first block having a first placing table configured to place thereon a cassette accommodating therein the substrate, a first transfer section under the normal pressure atmosphere, and a first transfer device configured to transfer the substrate in the first transfer section;

a second block having the liquid processing apparatus, the supercritical drying apparatus, a second transfer section under the normal pressure atmosphere, and a second transfer device configured to transfer the substrate in the second transfer section;

a third block having the dry-cleaning apparatus, a third transfer section under the decompressed pressure atmosphere, and a third transfer device configured to transfer the substrate in the third transfer section; and a second load-lock apparatus configured to switch the atmosphere around the substrate from a first one of the normal pressure atmosphere and the decompressed pressure atmosphere to a second one of the normal pressure atmosphere and the decompressed pressure atmosphere on a transfer path of the substrate, wherein the first block, the second load-lock apparatus, the third block, the first load-lock apparatus, and the second block are arranged in a row in a horizontal direction in this order.

4. The substrate processing apparatus of claim 1, further comprising:

a first block having a first placing table configured to place thereon a first cassette accommodating therein the substrate, a first transfer section under the normal pressure atmosphere, and a first transfer device configured to transfer the substrate in the first transfer section;

a second block having the liquid processing apparatus, the supercritical drying apparatus, a second transfer section under the normal pressure atmosphere, and a second transfer device configured to transfer the substrate in the second transfer section;

a third block having the dry-cleaning apparatus, a third transfer section under the decompressed pressure atmosphere, and a third transfer device configured to transfer the substrate in the third transfer section;

a fourth block having a second placing table configured to place thereon a second cassette accommodating therein the substrate, a fourth transfer section under the normal pressure atmosphere, and a fourth transfer device configured to transfer the substrate in the fourth transfer section;

a transition apparatus configured to deliver the substrate between the first transfer device and the second transfer device; and a second load-lock apparatus configured to switch the atmosphere around the substrate from a first one of the normal pressure atmosphere and the decompressed pressure atmosphere to a second one of the normal pressure atmosphere and the decompressed pressure atmosphere on a transfer path of the substrate, wherein the first block, the transition apparatus, the second block, the first load-lock apparatus, the third block, the second load-lock apparatus, and the fourth block are arranged in a row in a horizontal direction in this order.

5. The substrate processing apparatus of claim 1, further comprising:

a second block having the liquid processing apparatus, the supercritical drying apparatus, a second transfer section under the normal pressure atmosphere, and a second transfer device configured to transfer the substrate in the second transfer section, wherein, in the second block, the liquid processing apparatus and the supercritical drying apparatus are disposed to face each other in a horizontal direction with the second transfer section therebetween.

6. The substrate processing apparatus of claim 1, further comprising:

a second block having the liquid processing apparatus, the supercritical drying apparatus, a second transfer section under the normal pressure atmosphere, and a second transfer device configured to transfer the substrate in the second transfer section, wherein, in the second block, the liquid processing apparatus and the supercritical drying apparatus are disposed on at least one side of the second transfer section while being stacked on top of each other in a vertical direction.

7. The substrate processing apparatus of claim 1, further comprising:

a third block having the dry-cleaning apparatus, a third transfer section under the decompressed pressure atmosphere, and a third transfer device configured to transfer the substrate in the third transfer section, wherein the third block further has an etching apparatus configured to etch the surface of the substrate under the decompressed pressure.

8. A substrate processing method comprising:

processing a substrate by using a substrate processing apparatus as claimed in claim 1.

9. A substrate processing method comprising:

processing a substrate by using a substrate processing apparatus as claimed in claim 2.

10. A substrate processing method comprising:

processing a substrate by using a substrate processing apparatus as claimed in claim 3.

11. A substrate processing method comprising:

processing a substrate by using a substrate processing apparatus as claimed in claim 4.

12. A substrate processing method comprising:

processing a substrate by using a substrate processing apparatus as claimed in claim 5.

13. A substrate processing method comprising:

processing a substrate by using a substrate processing apparatus as claimed in claim 6.

14. A substrate processing apparatus, comprising:

a liquid processing apparatus configured to form a liquid film on a surface of a substrate;

a supercritical drying apparatus configured to dry the substrate by replacing the liquid film with a supercritical fluid;

a first load-lock apparatus configured to switch an atmosphere around the substrate from a first one of a normal pressure atmosphere and a decompressed pressure atmosphere to a second one of the normal pressure atmosphere and the decompressed pressure atmosphere on a transfer path of the substrate;

a dry-cleaning apparatus configured to dry-clean the surface of the substrate under a decompressed pressure;

a control device configured to perform forming of the liquid film by the liquid processing apparatus, drying of the substrate by the supercritical drying apparatus, switching of the atmosphere around the substrate by the first load-lock apparatus, and dry-cleaning of the substrate by the dry-cleaning apparatus in this order; and a third block having the drying-cleaning apparatus, a third transfer section under the decompressed pressure atmosphere, a third transfer device configured to transfer the substrate in the third transfer section, and a third load-lock apparatus configured to switch a decompression degree of the atmosphere around the substrate between the third transfer section and the dry-cleaning apparatus, wherein the dry-cleaning apparatus has a cleaning chamber in which the substrate is accommodated, and a pressure of the third transfer section is lower than a normal pressure and higher than a pressure of the cleaning chamber.

15. A substrate processing method comprising:

processing a substrate by using a substrate processing apparatus as claimed in claim 7.

16. A substrate processing method comprising:

processing a substrate by using a substrate processing apparatus as claimed in claim 14.

* * * * *